(12) United States Patent
Chen

(10) Patent No.: US 7,200,043 B2
(45) Date of Patent: Apr. 3, 2007

(54) NONVOLATILE MEMORY USING A TWO-STEP CELL VERIFICATION PROCESS

(75) Inventor: Chung-Zen Chen, Hsinchu (TW)

(73) Assignee: Elite Semiconductor Memory Technology, Inc., Hsinchu (TW)

( * ) Notice: Subject to any disclaimer, the term of this patent is extended or adjusted under 35 U.S.C. 154(b) by 59 days.

(21) Appl. No.: 11/141,145

(22) Filed: May 31, 2005

(65) Prior Publication Data
US 2006/0268619 A1    Nov. 30, 2006

(51) Int. Cl.
*G11C 11/34*   (2006.01)
(52) U.S. Cl. .................. 365/185.22; 365/185.03; 365/185.24
(58) Field of Classification Search ........... 365/185.22, 365/185.33, 185.24, 185.2, 185.03
See application file for complete search history.

(56) References Cited

U.S. PATENT DOCUMENTS 5,422,845 A    6/1995    Ong
6,507,522 B2 *    1/2003    Lee et al. ............... 365/185.3
6,768,680 B2    7/2004    Kato
6,801,457 B2 *    10/2004    Tanzawa et al. ....... 365/185.22
6,894,931 B2 *    5/2005    Yaegashi et al. ....... 365/185.22
7,068,542 B2 *    6/2006    Banks ................. 365/185.29
7,099,210 B2 *    8/2006    Hashiba et al. ............ 365/200

OTHER PUBLICATIONS

IEEE "Transactions on Electron Devices." vol. 48, No. 9, Sep. 2001, pp. 2032-2042.

* cited by examiner

*Primary Examiner*—Richard T. Elms
*Assistant Examiner*—Hien N Nguyen
(74) *Attorney, Agent, or Firm*—Hogan & Hartson LLP (57) ABSTRACT

A nonvolatile memory comprises a plurality of memory cells, a bit line control circuit and a verifying circuit. The bit line control circuit includes a driving circuit and a non-driving circuit. The verifying circuit verifies a first threshold voltage of the memory cell when the driving circuit drives the memory cell. The verifying circuit also verifies a second threshold voltage when the driving circuit does not drive the memory cell.

29 Claims, 7 Drawing Sheets

NONVOLATILE MEMORY USING A TWO-STEP CELL VERIFICATION PROCESS

FIELD OF THE INVENTION

The present invention relates to a nonvolatile memory and an electronic apparatus having a nonvolatile memory. More specifically, the present invention relates to an electrically erasable and programmable nonvolatile memory that uses a two-step verification process.

BACKGROUND

It is often desirable to use memory devices that will retain information even when the power is temporarily interrupted, or when the device is left without applied power for indefinite periods of time. A variety of semiconductor memories developed with this characteristic are known as nonvolatile memories. One category with broad application is electrically erasable and programmable read only memory ("EEPROM"). The information can be electronically stored and erased in memory cells of EEPROM. In order to assure the voltage state of a memory cell within a predetermined range after writing or erasing, verification becomes indispensable in the operation of nonvolatile memories. In particular, for a multi-level non-volatile memory in which a memory cell can store more than two states, it is important to precisely control the voltage of a memory cell after writing or erasing to perform the intended function.

Conventionally, a memory cell is programmed and verified during different periods of time. The memory cell is verified when both the word line and the bit line are at low voltage. If the threshold voltage of the memory cell has not reached a predetermined value, the word line and bit line are switched to high voltage to program (drive) the memory cell for a period of time. Each programming pulse has a fixed duration and a fixed word line voltage. After the first programming pulse, both the word line and bit line go back to low voltage and the memory cell is verified. If the memory cell fails the verification step, it is programmed again by the second programming pulse. The word line voltage either is fixed or steps up after each verification step. The memory cell is repeatedly verified and programmed until the threshold voltage of the memory cell reaches the predetermined value. The word line voltage and bit line voltage have to switch back and forth between high and low respectively for programming and verifying. Thus, the verification process is very time inefficient. Further information about this conventional verification mechanism can be found in the paper titled "Basic Feasibility Constraints for Multilevel CHE-Programmed Flash Memories," IEEE Transactions on Electron Devices, Vol. 48, No. 9, September 2001, pages 2032–2042.

One approach to avoid frequent voltage switching on the word lines and bit lines is to verify the threshold voltage of a memory cell while the memory cell is being driven. After a memory cell is programmed for a short period of time, the threshold voltage of the memory cell begins to be verified while the memory cell is concurrently programmed while both the word line and the bit line are at high voltage. The memory cell threshold voltage is repeatedly verified during programming until the threshold voltage of the memory reaches a predetermined value.

In a read operation, the content stored in a memory cell is read out with the bit line set to a low voltage. However, the threshold voltage is read out and verified when both the word line voltage and the bit line voltage are high in the alternative approach rather than low in the conventional verification process. Thus, the reading accuracy resulting from this alternative approach is reduced as compared to conventional verification process. With high word line and bit line voltage, the cell current is higher and the parasitic resistance significantly influences the accuracy of reading the threshold voltage, which in turn adversely affects the distribution of the threshold voltage.

Figure 1A:
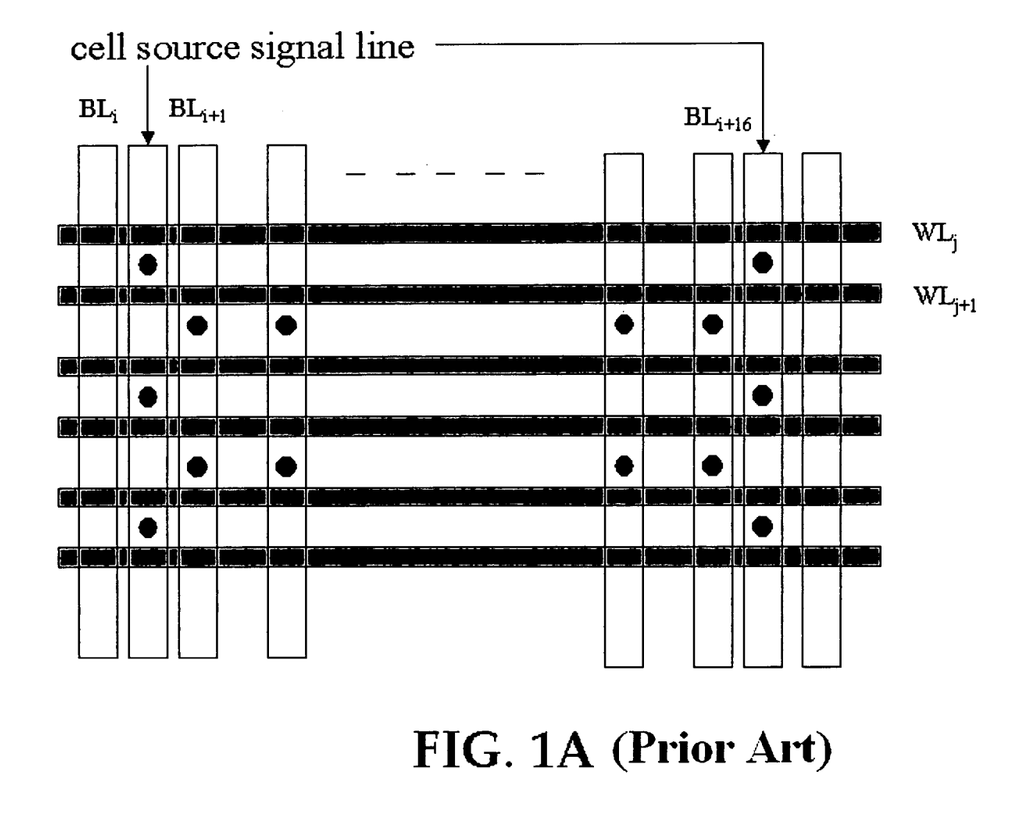
FIG. 1A is a schematic diagram of the memory cell structure of a nonvolatile memory.
Figures 1B, 2:
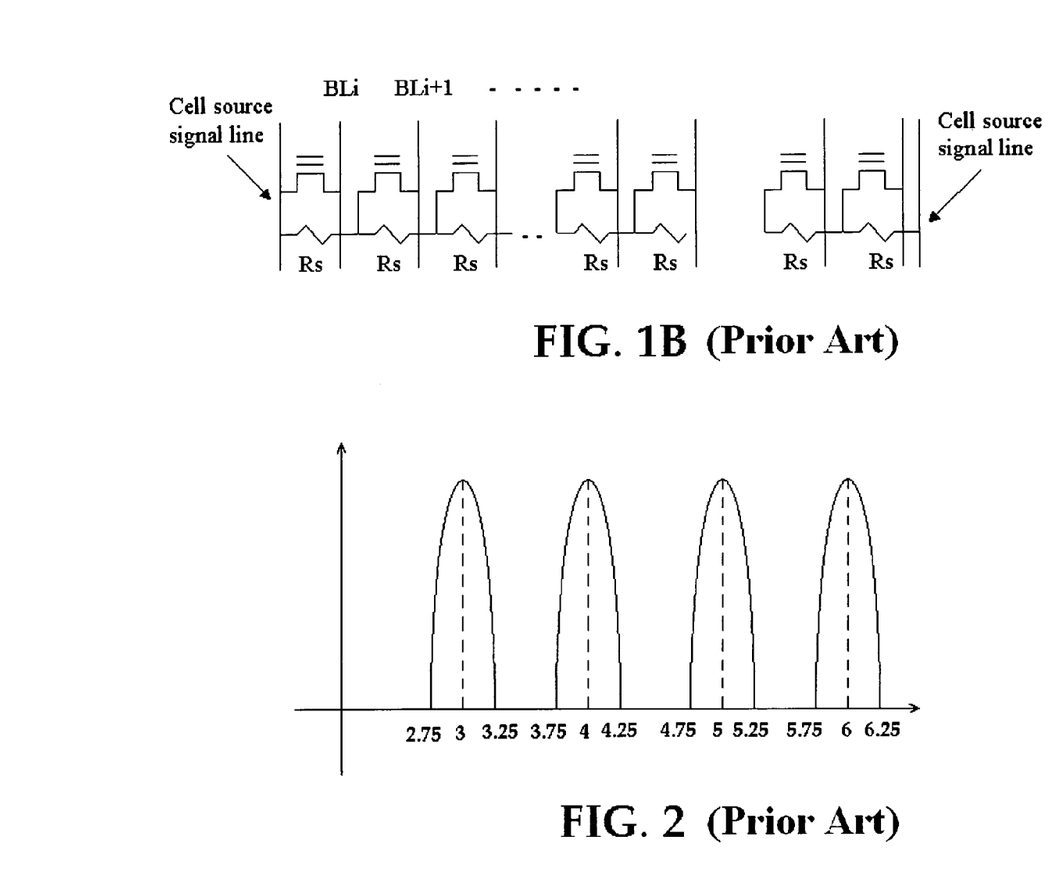
FIG. 1B is a schematic diagram of the source region parasitic resistance of memory cells between two cell source signal lines.
FIG. 2 shows the threshold voltage distribution of a four-level memory cell.

As shown in FIG. 1A, a nonvolatile memory includes a plurality of word lines $WL_1, \ldots, i, i+1, \ldots, m$, a plurality of bit lines $BL_1, \ldots, j, j+1, \ldots, n$, and a plurality of memory cells $M(WL_x, BL_y)$. Each memory cell has a source, a drain, a control gate and a floating gate. The drain connects to a bit line. The control gate connects to a word line. In this example of a NOR-type flash memory, the N+-doped self-aligned sourced of a set of every sixteen cells connect to a common cell source signal line. FIG. 1B shows the parasitic resistance of source regions of 16 adjoining memory cells between two common cell source signal lines. These source regions generate a voltage drop when a current flows through them. For example, if the word line voltage is set to 7 volts and the bit line voltage is set to 4 volts during programming, the cell current is from around 0.15 mA to around 0.2 mA depending on the cell characteristics. Because of the source parasitic resistance, the effective gate to source voltage is also reduced. As a result, the threshold voltage actually read out of the memory cell located in the center of two common cell source signal lines is reduced by about 0.23 volts to about 0.3 volts. On the other hand, during the read operation, the bit line is at low voltage and the cell current is from about 5 μA to 20 μA. The voltage drop for the center cell is from about 7 mV to 10 mV, which is much less than the range of voltage drop (0.23–0.3 Volts) during programming. The substantial voltage drop during programming introduces inaccuracy into a verification process performed concurrently with programming.

FIG. 2 shows a threshold voltage distribution of a multi-level transistor of a four-level memory cell. The targeted threshold voltages are respectively 3, 4, 5 and 6 volts. The conventional verification mechanism can obtain a threshold voltage distribution of about 0.5 volts, which leaves a 0.5 volts margin between neighboring levels. More specifically, the first level threshold voltage distribution ranges from 2.75 to 3.25 volts with a peak at 3 volts, the second level threshold voltage distribution ranges from 3.75 to 4.25 volts with a peak at 4 volts, the third level threshold voltage distribution ranges from 4.75 to 5.25 volts with a peak at 5 volts and the fourth level threshold voltage distribution ranges from 5.75 to 6.25 volts with a peak at 6 volts. Only when the threshold voltage of a cell falls within the appropriate distribution does the memory determine that the state of the cell is correctly stored so that it can be later read out. However, for the alternative approach, if the targeted threshold voltage is 3 volts, the threshold voltage of the center cell would pass the verification when the center cell is only programmed to about 2.7 to 2.77 volts because of the voltage drop caused by the source parasitic resistance. This inaccuracy adversely affects the threshold voltage distribution of a memory cell, and in particular, of a multi-level memory cell.

SUMMARY OF THE PREFERRED EMBODIMENTS

A nonvolatile memory comprises a plurality of memory cells, a bit line control circuit and a verifying circuit. The bit line control circuit includes a driving circuit and a non-driving circuit. The verifying circuit verifies a first threshold voltage of the memory cell when the driving circuit drives the memory cell. The verifying circuit also verifies a second threshold voltage when the driving circuit does not drive the memory cell.

BRIEF DESCRIPTION OF THE DRAWINGS

A more complete understanding of the present invention can be obtained by reference to the detailed description in conjunction with the accompanying drawings, which form part of the disclosure. These drawings depict only a typical embodiment of the invention and are not intended to limit its scope.

DETAILED DESCRIPTION OF THE PREFERRED EMBODIMENTS

Narrower threshold voltage distribution can enhance the performance in terms of mis-read and increase the yield of a nonvolatile memory, particularly for multi-level memory cells. To more precisely control the threshold voltage (Vth) of a memory cell, the threshold voltage is verified at least twice, once when the driving circuit drives the memory cell and again when the driving circuit does not drive the memory cell. Verifying the threshold voltage when the memory cell is driven can reduce the frequency of switching of bit line voltages between high and low. Verifying the threshold voltage when the memory cell is not driven can improve the measurement accuracy despite the voltage drop that may be present from the parasitic resistance. The described two-step verification process can be used for programming and for over-erase correction.

Figure 3:
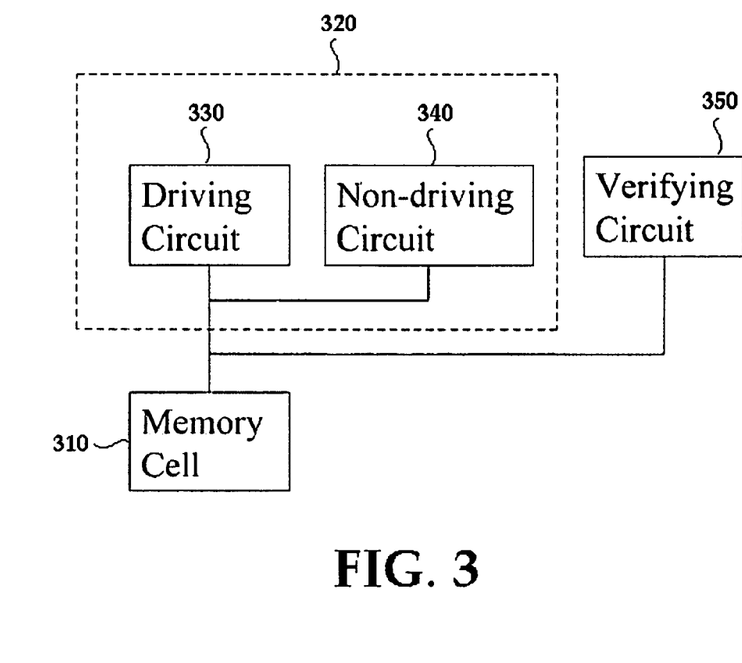
FIG. 3 is a block diagram of an exemplary embodiment of the invented non-volatile memory.

A device and method to improve threshold voltage distribution in a nonvolatile memory by two-step verification is described below. A nonvolatile memory includes a plurality of word lines, a plurality of bit lines and a plurality of memory cells. FIGS. 1A and 1B show an exemplary nonvolatile memory. The nonvolatile memory can be a NOR type or a NAND type memory. The memory cell can be a P-channel type or an N-channel type memory cell. In FIG. 3, a memory cell 310 connects to a bit line control circuit 320, which contains a driving circuit 330 and a non-driving circuit 340. The memory cell 310 also connects to a verifying circuit 350. When the memory cell 310 is not driven, the non-driving circuit 340 provides a low voltage to the memory cell 310. The verifying circuit 350 verifies the threshold voltage of the memory cell 310 when the memory cell 310 is driven and when the memory cell 310 is not driven.

In one embodiment, the verifying circuit 350 reads out and verifies a first threshold voltage of the memory cell 310 when the driving circuit 330 drives the memory cell 310. The verifying circuit 350 then reads out and verifies a second threshold voltage of the memory cell 310 when the driving circuit 330 does not drive the memory cell 310. Because they are read out respectively when the memory cell 310 is driven and when the memory cell 310 is not driven, the first threshold voltage may have a different value from the second threshold voltage although they are read out from the same cell 310. When the memory cell is driven, the bit line is at a high voltage provided by the driving circuit 330. When the memory cell is not driven, the bit line is at low voltage provided by the non-driving circuit 340. In another embodiment, the time sequence of these two verification operations can be reversed. In certain circumstances, the memory might implement three or more verification operations. For example, the threshold voltage first is verified when the memory cell 310 is not driven, then is verified when the memory cell 310 is driven, and is verified again when the memory cell 310 is not driven.

Figure 4:
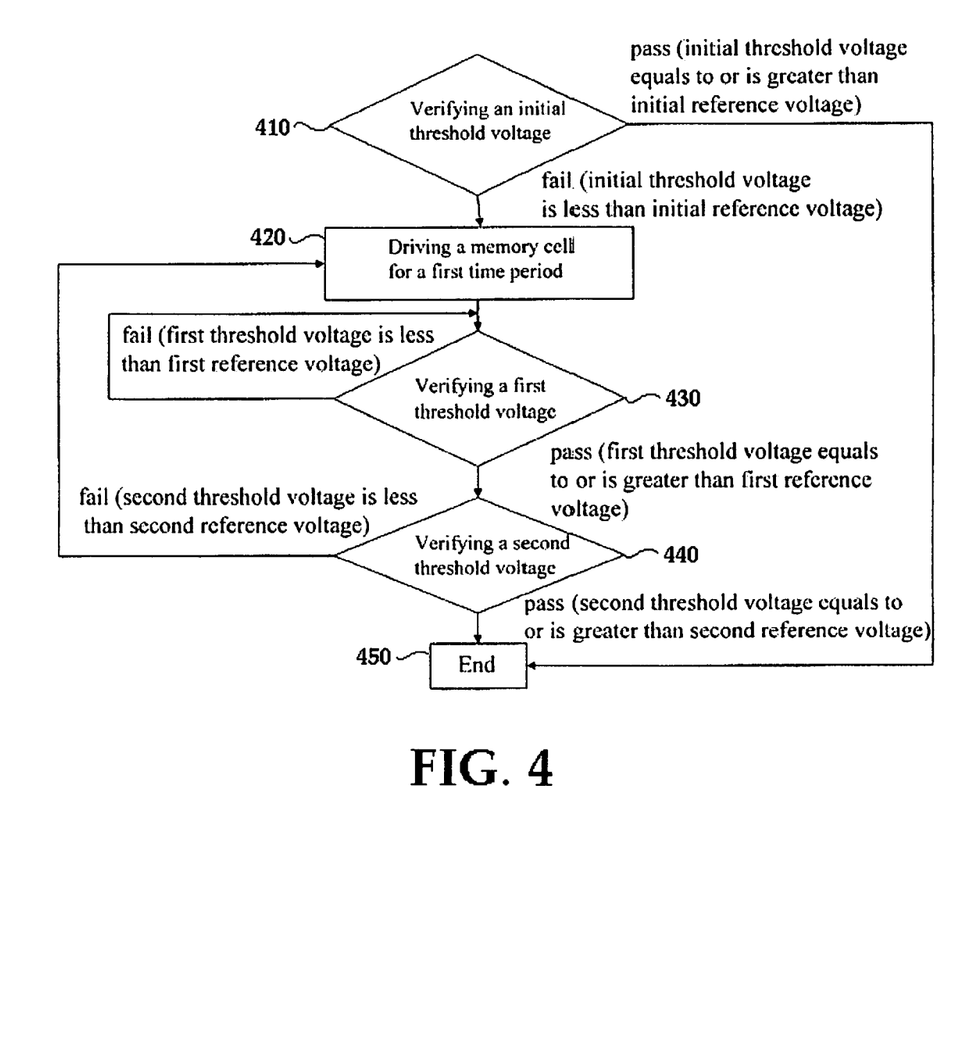
FIG. 4 is a flow chart diagram of an exemplary embodiment of a two-step verification.

FIG. 4 is a verification process flow according to a preferred embodiment of the invention. At step 410, an initial threshold voltage of a memory cell is read out and compared with an initial reference voltage when the memory cell 310 is not driven. At this time, both the word line and the bit line are at low voltage. If the initial threshold voltage equals or exceeds the initial reference voltage, the verification process is finished. At step 420, if the initial threshold voltage is less than the initial reference voltage, the memory cell 310 is driven for a first time period to increase its threshold voltage. At this time, both the word line and the bit line are at high voltage. For example, the word line voltage is about 9 volts and the bit line voltage is around 4.5 volts for programming process and both word line and bit line voltages are respectively between about 0 volts and about 4.5 volts for over-erase correction. The first time period should be longer than the time needed to read out the threshold voltage. For example, if the reading time is about 100 ns, the first time period can range from approximately 200 ns to approximately 500 ns. At step 430, a first threshold voltage of the memory cell begins to be read out and compared with a first reference voltage by the verifying circuit 350 while the memory cell 310 is driven. If the first threshold voltage is less than the first reference voltage, the memory cell 310 is continuously driven. The first threshold voltage is read out and compared again with the first reference voltage. In other words, the memory cell 310 is continuously driven and its first threshold voltage is repeatedly verified until the first threshold voltage equals or is larger than the first reference voltage.

At step 440, once the first threshold voltage reaches the first reference voltage, the bit line is switched to a low voltage, for example about 1 volt, provided by the non-driving circuit 340. At this time, the memory cell 310 is not driven. A second threshold voltage is read out and compared with a second reference voltage by the verifying circuit 350. If the second threshold voltage is less than the second reference voltage, steps 420 to 440 are repeated. In other words, the bit line goes back to a high voltage and the memory cell 310 is driven for the first time period again to increase its threshold voltage. Then, the verifying circuit 350 verifies the first threshold voltage at step 430 and verifies the second threshold voltage at step 440. If the second threshold voltage equals or is larger than the second reference voltage, the verification process of the memory cell 310 is completed. The whole verification process is repeated for the next memory cell.

Figure 5:
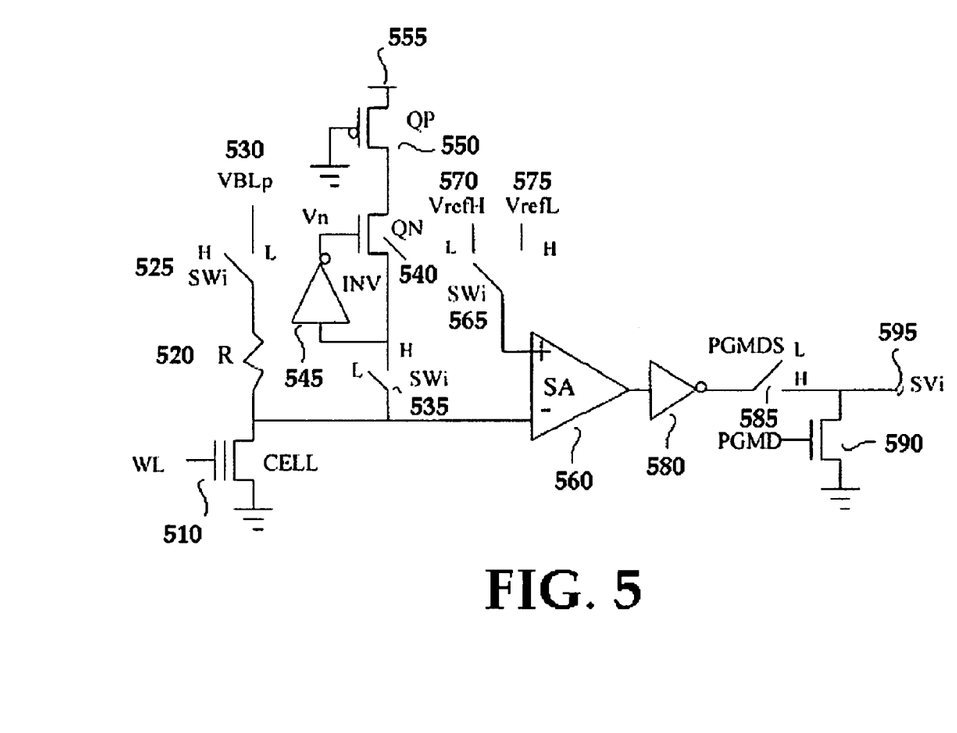
FIG. 5 is a schematic diagram of an exemplary embodiment of circuits shown in FIG. 3.

FIG. 5 is a schematic circuit diagram for an embodiment as shown in FIG. 3 to carry out two-step verification. The memory cell 310 is implemented by an EEPROM cell 510, which includes a drain, a source, a control gate, and a floating gate. The control gate connects to a word line. The source connects to a ground voltage. The drain connects to the driving circuit (330 in FIG. 3), the non-driving circuit (340 in FIG. 3), and the verifying circuit (350 in FIG. 3). The driving circuit of FIG. 5 includes a resistor 520, a first switch 525 controlled by a switch signal SWi, and a bit line programming voltage terminal 530 (VBLp). One end of the resistor 520 connects to the drain of the memory cell 510. The other end of the resistor 520 connects to the first switch 525. When the switch signal SWi is low, the first switch 525 connects the bit line programming voltage terminal 530 (VBLp) to drive the memory cell 510. When the switch signal SWi is high, the first switch 525 is disconnected from the bit line programming voltage terminal 530 (VBLp).

The non-driving circuit of FIG. 5 includes a second switch 535 controlled by the signal SWi, a first N-type transistor 540, a first inverter 545, a P-type transistor 550, and a power supply terminal 555. When the switch signal SWi is low, the non-driving circuit is not connected to the memory cell. When the switch signal SWi is high, the non-driving circuit is connected to the memory cell. The drain of the memory cell 510 connects to a source of the first N-type transistor 540 and an input end of the inverter 545. A gate of the first N-type transistor 540 connects to an output end of the inverter 545. A drain of the first N-type transistor 540 connects to a drain of the P-type transistor 550. A gate of the P-type transistor 550 connects to the ground voltage. A source of the P-type transistor 550 connects to the power supply terminal 555. In one embodiment, the power supply terminal 555 provides a voltage at about 3 volts. When the switch signal SWi is high, the non-driving circuit provides a voltage at about 1 volt to the drain of the memory cell 510.

The verifying circuit of FIG. 5 includes a sense amplifier 560, a third switch 565 controlled by the switch signal SWi, a first reference voltage 570, a second reference voltage 575, a second inverter 580, a fourth switch 585 controlled by a program delay signal PGMDS, a second N-type transistor 590, and an output terminal 595. A negative input end of the sense amplifier 560 connects to the drain of the memory cell 510. Through the third switch 565, a positive input end of the sense amplifier 560 connects to either the first reference voltage or the second reference voltage depending on the switch signal SWi. When the switch signal SWi is low, the positive input end of the sense amplifier 560 connects to the first reference voltage and the memory cell connects 510 is driven by the driving circuit. As a result, the first threshold voltage is read out from the memory cell 510 and the sense amplifier 560 compares the first threshold voltage with the first reference voltage 570. When the switch signal SWi is high, the positive input end of the sense amplifier 560 connects to the second reference voltage 575 and the memory cell 510 is provided a low voltage by the non-driving circuit 340. As a result, the second threshold voltage is read out from the memory cell 510 and the sense amplifier 560 compares the second threshold voltage with the second reference voltage 575.

An output end of the sense amplifier 560 connects to an input end of the second inverter 580. The output end of the second inverter 580 connects to a fourth switch controlled by the program delay signal PGMDS. When the program delay signal PGMDS is low, the fourth switch 585 forms an open circuit. The output terminal 595 outputs low voltage as the verifying signal SVi. When the program delay signal PGMDS is high, through the fourth switch 585, the output end of the inverter 580 connects to a drain of the second N-type transistor 590 and the output terminal 595. A gate of the second N-type transistor 590 connects to output delay signal PGMD. A source of the second N-type transistor 590 connects to the ground voltage. The output terminal 595 outputs the verifying signal SVi.

The embodiment of a nonvolatile memory as shown in FIG. 3 may further include a verification control circuit, which contains a program delay circuit, a switch signal generating circuit and a confirmation circuit. The verification control circuit is used to receive program signal and the verifying signal SVi and to the output the switch signal SWi, the program delay signal PGMDS, and the output delay signal PGMD.

Figure 6:
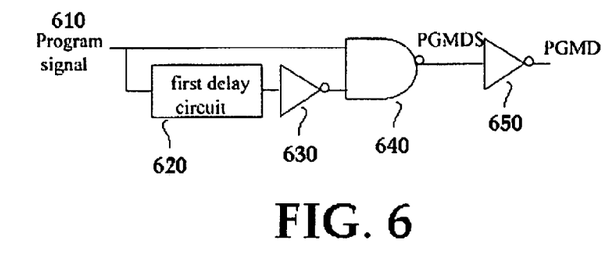
FIG. 6 is a schematic diagram of an exemplary embodiment of a program delay circuit.

FIG. 6 is a schematic diagram of a program delay circuit to generate a program delay signal PGMDS. A program signal 610 connects to an input end of a first NAND gate 640. The program signal 610 is delayed a first time period by a first delay circuit 620. In one embodiment, the first time period is from approximately 200 ns to approximately 500 ns. An output end of the first delay circuit 620 connects to an input end of a third inverter 630. An output end of the third converter 630 connects to the other input end of the first NAND gate 640. An output of the first NAND gate 640 is the program delay signal PGMDS used to control the fourth switch 585 in the verifying circuit. The output end of the first NAND gate 640 connects to an input end of a fourth inverter 650. An output end of the third converter 650 is the output delay signal PGMD used to control the second N-type transistor 590 of the verifying circuit. After the program signal 610 becomes high, the program delay signal PGMDS becomes low a first time period and changes to high. As a result, the memory cell 510 is programmed for a first time period before the verifying circuit begins to verify the first threshold voltage.

Figure 7:
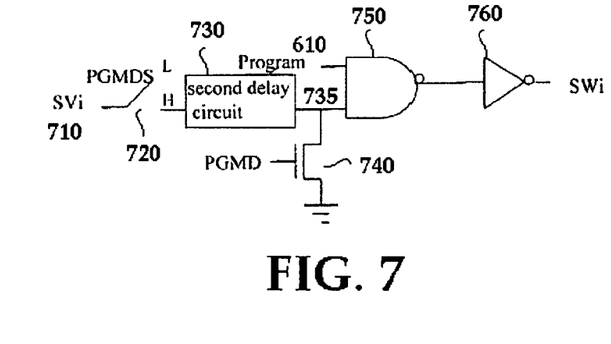
FIG. 7 is a schematic diagram of an exemplary embodiment of a switch signal generating circuit 7.

FIG. 7 is a schematic diagram of a switch signal generating circuit. The program signal 610 connects to one input end of a second NAND gate 750. A verifying signal SVi 710 connects to a fifth switch 720 controlled by the program delay signal PGMDS. The fifth switch 720 connects to a second delay circuit 730. When the program delay signal PGMDS 720 is high, the verifying signal SVi is delayed a first time period to generate a delayed verifying signal 735. In one embodiment, the first time period is from approximately 200 ns to approximately 500 ns. The delayed verifying signal 735 connects to the other input end of the second NAND gate 750 and a drain of a third N-type transistor 740. A gate of the third N-type transistor 740 connects to output delay signal PGMD. A source of the third N-type transistor 740 connects to the ground voltage. An output of the second NAND gate connects to an input end of a fifth inverter 760. The fifth inverter 760 outputs the switch signal SWi. As a result, the switch signal goes high the first time period after the verifying signal goes high. Likewise, the switch signal goes low the first time period after the verifying signal goes low. If the memory cell 510 fails the verification of the second threshold voltage, the verifying signal goes from high to low. After the first time period delay, the switch signal also goes from high to low to resume the programming of the memory cell 510. Because the memory cell 510 passed the verification of the first threshold voltage before, it certainly will pass the same verification again. Thus, soon after the switch signal SWi goes low, the verifying signal SVi changes from low to high. However, the switch signal SWi remains low for the first time period to program the memory cell 510 before it goes to high again.

Figure 8:
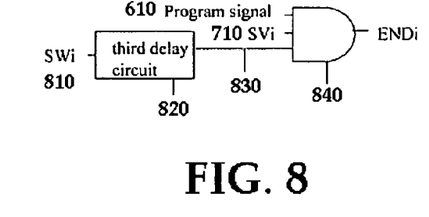
FIG. 8 is a schematic diagram of an exemplary embodiment of a control circuit to determine whether a memory cell passes the two-step verification.

FIG. 8 is a schematic diagram of a confirmation circuit that determines whether the memory cell 510 passes the two-step verification process. The program signal 610 connects to a first input end of a first AND gate 840. The verifying signal SVi 710 connects to a second input end of a first AND gate 840. A switch signal SWi 810 connects to a third delay circuit 820. The switch signal SWi 810 is delayed the first time period by the third delay circuit 820 to generate a delayed switch signal 830. In one embodiment, the first time period is from approximately 200 ns to approximately 500 ns. The delayed switch signal 830 connects to the third input end of the first AND gate 840. The first AND gate 840 outputs a cell verification complete signal ENDi. The sense amplifier 560 needs time to respond to new inputs and reach a stable output value once the switch signal SWi changes from low to high, which causes the memory cell 510 to be switched from a driven status to a non-driven status. As a result, the second threshold voltage has to be verified whether it reaches the second reference voltage when the verifying signal 710 remains high for the first time period after the switch signal SWi 810 goes from low to high. When the memory cell 510 passes the two-step verification, steps 410–450 are repeated to verify the next memory cell until all memory cells are verified.

Figure 9:
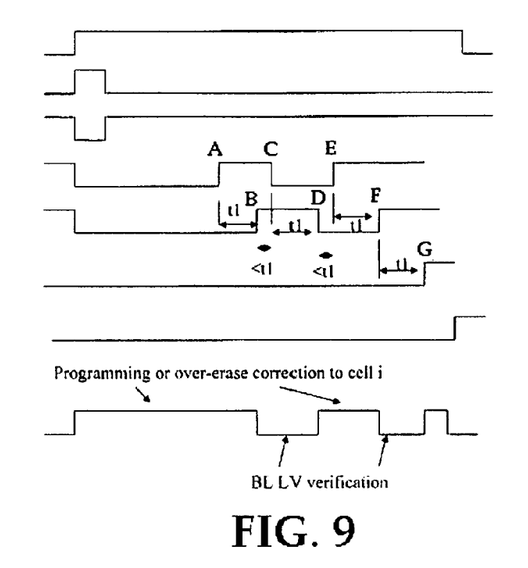
FIG. 9 is a timing chart to illustrate relationship of various signals generated by an exemplary embodiment of the invented non-volatile memory.

FIG. 9 is a timing chart that illustrates operation of the two-step verification process. First, the program signal goes high to initiate programming after the memory cell fails the initial verification at step 410. After the program signal goes high, the program delay signal PGMDS changes to low voltage and stays at low voltage for the first time period so that the memory cell 510 is programmed for the first time period before the verifying circuit 350 outputs the actual verifying signal SVi derived by reading out the first threshold voltage and comparing it with the first reference voltage. The program delay signal PGMDS goes high the first time period after the program signal goes high and remains high as long as the program signal is high.

For the first time period, because the program delay signal PGMDS is low and the output delay signal PGMD is high, the verifying circuit 350 outputs a low verifying signal SVi. Afterwards the value of the verifying signal SVi may change depending on whether the first threshold voltage reaches the first reference voltage. At point A, the verifying signal SVi goes from low to high when the first threshold voltage equals or is greater than the first reference voltage. At point B, the switch signal SWi goes from low to high the first time period after the verifying signal SVi goes to high. When the switch signal SWi goes high, the memory cell 510 is switched to the non-driven status. Then, the second threshold voltage is read out and compared with the second reference voltage. If the second threshold voltage is less than the second reference voltage, at point C, the verifying signal goes from high to low. At point D, the switch signal SWi goes from high to low the first time period after the verifying signal SVi goes to low. When the switch signal SWi goes to low again, the memory cell 510 is driven again. However, the first threshold voltage has already been greater than the first reference voltage. At point E, the verifying signal SVi changes from low to high. At point F, the switch signal SWi also changes from low to high the first time period after the verifying signal SVi goes to high again. The memory cell is then programmed for at least the first time period again from point D to point F. After the switch signal SWi goes to high, the memory cell is not driven. The positive input end of the sense amplifier 560 changes to the second reference voltage 575 and the negative input end of the sense amplifier 560 changes to the second threshold voltage. Because the sense amplifier takes some time to reach a new stable status, the second threshold voltage is verified the first time period after the switch signal switches to high. If the second threshold voltage then passes the verification, the two-step verification of the memory cell 510 is finished. As a result, the ENDi signal goes from low to high and the program signal goes from high to low. The next memory cell will subsequently be verified following the same steps until all memory cells are verified. Then, the END signal will change from low to high.

Although the invention has been described in terms of exemplary embodiments, it is not limited thereto. The described embodiment is to be considered in all respects only as illustrative and not as restrictive. The present invention may be embodied in other specific forms without departing from its essential characteristics. The scope of the invention, therefore, is indicated by the appended claims rather than by the foregoing description. All changes, which come within the meaning and range of the equivalents of the claims, are to be embraced within their scope.

What is claimed is:

1. A nonvolatile memory comprising:
   a plurality of memory cells;
   a bit line control circuit comprising a driving circuit and a non-driving circuit; and
   a verifying circuit,
   wherein the verifying circuit verifies a first threshold voltage of the memory cell when the driving circuit drives the memory cell and the verifying circuit verifies a second threshold voltage when the driving circuit does not drive the memory cell.

2. The nonvolatile memory of claim 1, wherein the verifying circuit verifies the first threshold voltage of the memory cell when the driving circuit drives the memory cell and then the verifying circuit verifies the second threshold voltage when the driving circuit does not drive the memory cell.

3. The nonvolatile memory of claim 1, wherein the verifying circuit verifies an initial threshold voltage of the memory cell when the driving circuit does not drive the memory cell, then the verifying circuit verifies the first threshold voltage when the driving circuit drives the memory cell, and then the verifying circuit verifies the second threshold voltage when the driving circuit does not drive the memory cell.

4. The nonvolatile memory of claim 1, wherein the verifying circuit verifies the first threshold voltage of the memory cell first when the driving circuit does not drive the memory cell, then when the driving circuit drives the memory cell, and then again when the driving circuit does not drive the memory cell.

5. The nonvolatile memory of claim 1, wherein the verifying circuit verifies the first threshold voltage of the memory cell by comparing the first threshold voltage with a first reference voltage when the driving circuit drives the memory cell, and the verifying circuit verifies the second threshold voltage of the memory cell by comparing the second threshold voltage with a second reference voltage when the driving circuit does not drive the memory cell.

6. The nonvolatile memory of claim 5, wherein the first reference voltage is higher than the second reference voltage.

7. The nonvolatile memory of claim 5, wherein the driving circuit ceases to drive the memory cell when the first threshold voltage of the memory cell is not less than the first reference voltage.

8. The nonvolatile memory of claim 1, wherein the memory cell can store multi-level data.

9. The nonvolatile memory of claim 1, wherein the driving circuit increases a threshold voltage of the memory cell by charge injection using a tunnel current during a programming process or an over-erase correction process.

10. The nonvolatile memory of claim 1, wherein the driving circuit increases a threshold voltage of the memory cell by charge injection using hot electrons during a programming process or an over-erase correction process.

11. The nonvolatile memory of claim 1, wherein the driving circuit comprises a resistor, a first switch controlled by a switch signal and a bit line programming voltage terminal.

12. The nonvolatile memory of claim 1, wherein the non-driving circuit comprises a second switch controlled by a switch signal, a first N-type transistor, a first inverter, a P-type transistor and a power supply terminal.

13. The nonvolatile memory of claim 1, wherein the verifying circuit comprises a sense amplifier, a third switch controlled by a switch signal, a first reference voltage, a second reference voltage, a second inverter, a fourth switch controlled by a program delay signal, a second N-type transistor and an output terminal.

14. The nonvolatile memory of claim 1, further comprising a verification control circuit.

15. The nonvolatile memory of claim 14, wherein the verification control circuit further comprises a program delay circuit, a switch signal generating circuit and a confirmation circuit.

16. The nonvolatile memory of claim 15, wherein the program delay circuit comprises a program signal, a first delay circuit, a third inverter, a first NAND gate and a fourth inverter.

17. The nonvolatile memory of claim 15, wherein the switch signal generating circuit comprises a program signal, a second NAND gate, a verifying signal, a fifth switch controlled by a program delay signal, a second delay, a third N-type transistor and a fifth inverter.

18. The nonvolatile memory of claim 15, wherein the confirmation circuit comprises a program signal, a first AND gate, a verifying signal, a switch signal and a third delay circuit.

19. The nonvolatile memory of claim 1, wherein the verifying circuit begins to verify the first threshold voltage of the memory cell after the driving circuit has been driving the memory cell for a first time period.

20. The nonvolatile memory of claim 19, wherein the first time period ranges approximately from 200 to 500 nanoseconds.

21. The nonvolatile memory of claim 1, wherein the memory cell is a P-channel type or an N-channel type memory cell.

22. The nonvolatile memory of claim 1, wherein the nonvolatile memory is a NOR type or a NAND type memory.

23. A semiconductor device that includes the nonvolatile memory of claim 1.

24. A method of verifying a threshold voltage of a memory cell of a nonvolatile memory, comprising:
   comparing a first threshold voltage of the memory cell with a first reference voltage when the memory cell is driven; and
   comparing a second threshold voltage of the memory cell with a second reference voltage when the memory cell is not driven.

25. The method of claim 24, wherein when the memory cell is driven, the bit line is connected to a programming voltage terminal.

26. The method of claim 24, wherein the first reference voltage is higher than the second reference voltage.

27. The method of claim 24, further comprising:
   driving the memory cell for a first time period before comparing the first threshold voltage of the memory cell with a first reference voltage; and
   ceasing to drive the memory cell when the first threshold voltage of the memory cell is not less than the first reference voltage.

28. The method of claim 27, wherein the first time period ranges approximately from 200 to 500 nanoseconds.

29. A method of verifying a threshold voltage of a memory cell of a nonvolatile memory, comprising:
   (a) comparing an initial threshold voltage of the memory cell with an initial reference voltage;
   (b) driving the memory cell for a first time period if the initial voltage is less than the second reference voltage;
   (c) comparing a first threshold voltage of the memory cell with a first reference voltage when the memory cell is driven;
   (d) continuously driving the memory cell if the first threshold voltage is less than the first reference voltage;
   (e) comparing the second threshold voltage of the memory cell with the second reference voltage when the memory cell is not driven; and
   (f) repeating steps (b)–(e) if the second threshold voltage of the memory cell is less than the second reference voltage.

* * * * *